United States Patent

[11] 3,568,069

[72] Inventor William D. Gabor
Amherst, N.H.
[21] Appl. No. 784,081
[22] Filed Dec. 16, 1968
[45] Patented Mar. 2, 1971
[73] Assignee Sanders Associates, Inc.
Nashua, N.H.

[54] DIGITALLY CONTROLLED FREQUENCY SYNTHESIZER
15 Claims, 2 Drawing Figs.

[52] U.S. Cl. .......... 328/14, 328/37, 328/48, 328/58, 328/167
[51] Int. Cl. .......... H03b 1/04, H03k 7/08
[50] Field of Search .......... 328/14, 37, 41, 42, 39, 48, 58, 167

[56] References Cited

UNITED STATES PATENTS

| | | | |
|---|---|---|---|
| 3,258,696 | 6/1966 | Heymann | 328/48X |
| 3,263,174 | 7/1966 | Bjorkman et al. | 328/48X |
| 3,283,254 | 11/1966 | Haynie | 328/48X |
| 3,424,986 | 1/1969 | Vasseur | 328/48 |
| 3,456,200 | 7/1969 | Bos | 328/48 |
| 3,453,551 | 7/1969 | Haberle | 328/37X |
| 3,464,018 | 8/1969 | Cliff | 328/14X |
| 3,500,213 | 3/1970 | Ameau | 328/14 |

*Primary Examiner*—John S. Heyman
*Attorney*—Louis Etlinger

ABSTRACT: A digitally controlled variable frequency synthesizer has a register which stores a number corresponding to the desired output frequency. This number is loaded into a counter which counts pulses from a stable, fixed-frequency oscillator. The counter then counts backward from that number to zero and then emits an output pulse. That causes the stored number to be loaded into the counter again. The frequency of these output pulses thus depends upon the number stored in the register. By properly selecting the number, this frequency can be varied widely and yet it has the stability of the fixed crystal oscillator.

INVENTOR.
WILLIAM D. GABOR
BY
ATTORNEY

INVENTOR.
WILLIAM D. GABOR
BY
ATTORNEY

DIGITALLY CONTROLLED FREQUENCY SYNTHESIZER

BACKGROUND OF THE INVENTION

This invention relates to a frequency synthesizer. It relates more particularly to a digital synthesizer which can be programmed to generate any one of a wide variety of frequencies.

A digital frequency synthesizer can be used in many varied applications demanding a variable reference frequency source with the accuracy of a crystal controlled oscillator. For example, it can function as a local oscillator in a radio receiver. In this way, the receiver can be controlled remotely to automatically perform various routines such as accurately sweeping over a selected frequency range or periodically tuning in on particular frequencies of interest.

Digital synthesizers broadly are not new. They are used primarily because they are more accurate and stable than their analogue counterparts. Still however, prior digital synthesizers have drawbacks which limit their wider application, especially in automatic frequency surveillance systems.

More particularly, the prior systems are fairly large and complex, requiring many frequency mixing sections and hardware. These elements tend to produce spurious frequencies which are very difficult to eliminate from the synthesizer output.

SUMMARY OF THE INVENTION

Accordingly, this invention aims to provide a digitally controlled frequency synthesizer which can be varied over a relatively wide frequency range.

Another object of the invention is to provide a frequency synthesizer whose output frequency has good spectral purity.

A further object of the invention is to provide a digitally controlled frequency synthesizer which can switch rapidly from one frequency to another.

Another object of the invention is to provide a digitally controlled frequency synthesizer which can change frequency without generating appreciable noise in the output signal.

Still another object of the invention is to provide a digitally controlled frequency synthesizer which is relatively small and compact.

Another object is to provide a variable frequency synthesizer which has the accuracy of a fixed frequency oscillator.

A further object of the invention is to provide such a synthesizer which is relatively simple and economical to make.

Another object of the invention is to provide a frequency synthesizer which requires a minimum amount of maintenance and adjustment and, therefore, can be left unattended for a relatively long period of time.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

In general, the present system comprises a pair of similar synthesizer sections. The output signals of the two sections are mixed together to develop a single frequency which may be used as a variable reference frequency. The first synthesizer section develops an output signal whose frequency may be varied over selected relatively widely spaced frequency increments, whereas the second section develops a signal whose frequency is variable over more narrowly spaced increments. Thus, the two sections together yield both coarse and fine frequency control.

Each synthesizer section comprises a register which, on command, receives a number corresponding to the desired frequency from a remote computer. The number in the register is gated to a counter which counts clock pulses from a fixed oscillator. Each time a number is loaded into the counter, the counter commences counting from that number backwards to zero. When the counter reaches zero, it emits an output pulse to a signal-purifying network. The output pulse also reloads the counter once again with the number in the register. Thus, the counter periodically counts backwards from this number and emits an output pulse each time it reaches zero. Resultantly, the output signal applied to the purifying network will have a frequency which is a selected submultiple of the frequency of the oscillator driving the counter. This particular frequency will depend on the frequency-identifying number contained in the register.

If a larger number is loaded into the register, the counter takes longer (i.e., more clock pulses) to count backwards to zero. Therefore, the counter emits fewer output pulses during a given time interval and a lower frequency signal is emitted to the purifying network. Conversely, if the register contains a smaller number, then the counter takes less time to reach zero during each counting cycle and, therefore, the output to the purifying network has a higher frequency. Thus, by changing the contents of the register, the frequency of the signal applied to the purifying network can be varied in discrete increments over a relatively wide range.

The purifying network to be described in detail later is included in each synthesizer section in order to insure that the output of each section consists of a single spectral line or frequency devoid of harmonics and sidebands. Since the output signal may vary over a frequency range which is greater than one octave, the purifying network preferably comprises two or more filter sections having different passbands. The signal from the counter is applied to one or another of these sections, depending upon its frequency. For simplicity, we will describe here a purifying network having only two filter sections.

In order to determine which filter section in each synthesizer section should be employed in a given instance, a decoder decodes the frequency-identifying number in the corresponding register. If the number is smaller than a particular number corresponding to an optimum frequency crossover point between the two filter sections, the decoder enables the high pass filter section.

On the other hand, if a relatively high number is contained in the register corresponding to a relatively low frequency in the range, the decoder enables the low pass filter section. Thus, the output of the counter is applied to the filter section having the proper passband characteristic for the particular signal.

The signal from each filter section is mixed with the output of a fixed reference oscillator to develop a selected difference frequency.

The output of the coarse-tune synthesizer section is multiplied to develop widely spaced frequency increments before being mixed with the output from the fine tune synthesizer section as described previously.

Thus, by loading the appropriate number in the register in each synthesizer section, any one of a wide variety of frequencies can be obtained from the system. These numbers may be varied in accordance with a predetermined sequence to cause the synthesizer to sweep up or down in frequency in predetermined frequency increments. Also, using more complex programming routines, the synthesizer can be made to undertake frequency sweeps covering many different ranges and frequency increments. Thus, the present system is particularly suited for the remote control of the local oscillator frequency of an unmanned receiver.

Once the numbers are loaded into the registers in the two synthesizer sections, the system continues to generate a precisely determined frequency corresponding to those numbers without any frequency drift. That is, the counter in each synthesizer section continues to recycle automatically so that the output frequency remains exactly the same as long as no new data is loaded into the registers. Further, the synthesizer is fast and responds quickly to changing frequency input data because it uses directly encoded, highly periodic counters. Also, the system has relatively few mixers and special signal-purifying networks so that it produces relatively few spurious signals, i.e.; signals having other than the desired frequency.

BRIEF DESCRIPTION OF THE DRAWINGS

For a fuller understanding of the nature and objects of the invention, reference should be had to the following detailed description taken in connection with the accompanying drawings, in which.

DESCRIPTION OF THE PREFERRED EMBODIMENT

Figure 1:
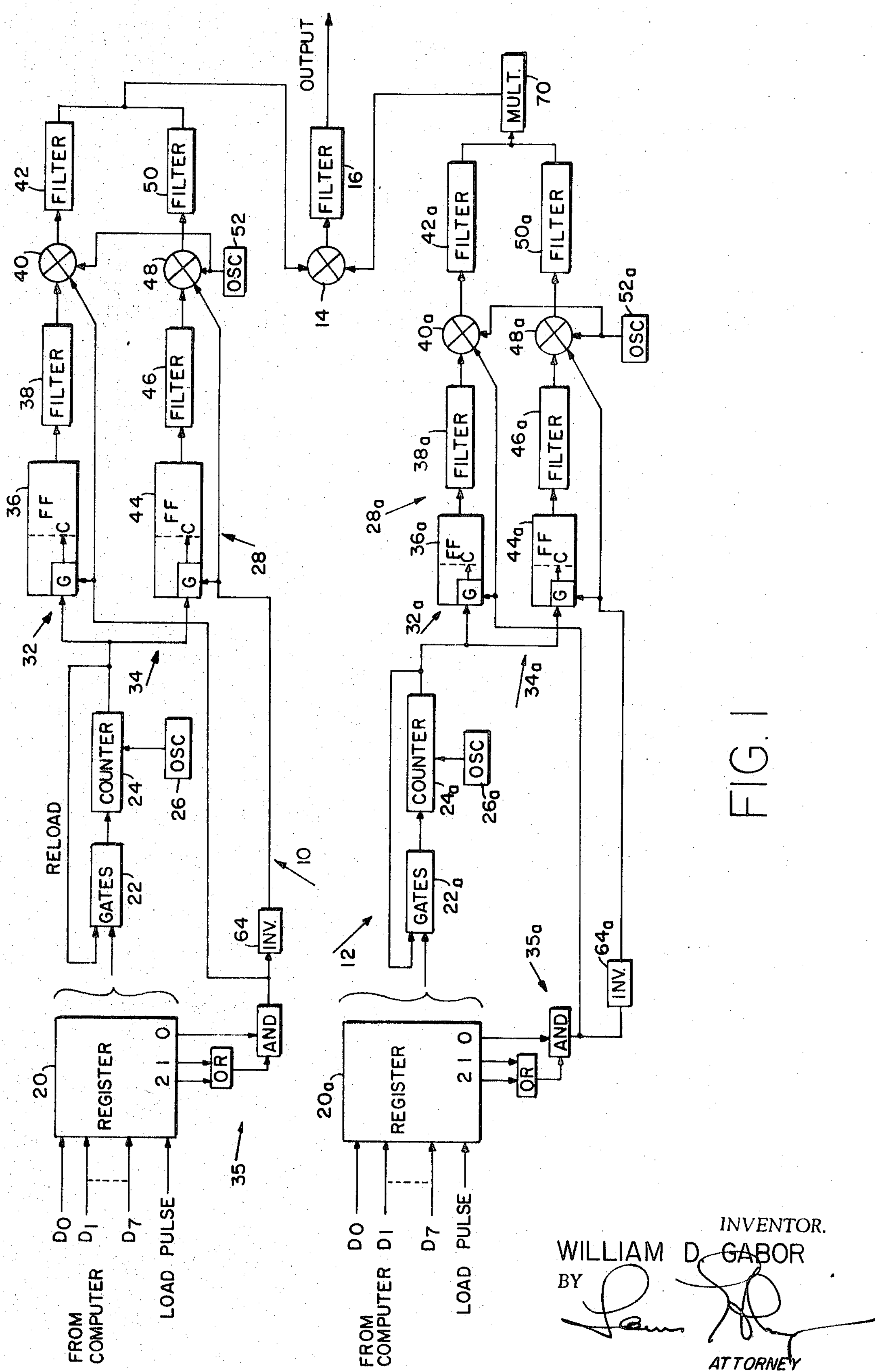
FIG. 1 is a block diagram showing a digitally controlled frequency synthesizer embodying the principles of this invention.

Referring now to FIG. 1 of the drawings, the subject synthesizer comprises a fine-tune section indicated generally at 10 and a coarse tune section indicated generally at 12. Section 10 develops an output signal which can be varied in relatively small frequency increments over a relatively small range of frequencies. Section 12, on the other hand, can be controlled so that its output frequency varies in relatively large increments over a relatively large frequency range. The outputs of the two synthesizer sections 10 and 12 are mixed together in a conventional mixer 14. The output of mixer 14 is applied to a conventional filter 16 which passes only the sum of the frequencies from the two synthesizer sections. The resulting signal is fed either directly or by way of additional mixing and filter stages to the tuning section of a radio receiver (not shown). Alternatively the output may be used directly as a variable reference frequency in some cases.

For purposes of illustration, we will describe a system in which the output of the coarse tune synthesizer section 12 can be varied in 138 discrete elements from about 22571 kHz. to about 23360 kHz. and the fine-tune section 10 can be varied in 129 discrete increments over 12.8 kHz. Of course, depending upon the particular application, the frequency ranges may be different and also the total number of available frequencies within each range may vary.

Synthesizer section 10 comprises a binary register 20 which stores a number loaded into it from a computer (not shown). This number corresponds to one of the frequencies obtainable from the fine tune section 10. In the illustrated embodiment where synthesizer section 10 has the above-described frequency capability, register 20 typically has a capacity of 8 bits. The input data is received on 8 data lines labeled $D_0$, $D_1$, $D_7$ with $D_0$ leading to the most significant register 20 stage. A load pulse applied to register 20 loads new frequency commands into the register. Each command remains in the register until the occurrence of another LOAD pulse.

The number in register 20 is loaded by way of a set of gates 22 into a counter 24. Counter 24 counts pulses from a highly stable fixed oscillator 26. Each time a number is loaded into counter 24, the counter counts backwards to zero in response to successive pulses from oscillator 26. Then when the count in counter 24 reaches zero, a decoder in the counter senses this fact and the counter emits an output pulse to a signal-purifying network indicated generally at 28. Each output pulse from counter 24 is also applied to enable gates 22 so that the number in register 20 is again loaded into the counter.

Thus, assuming the number in register 20 remains the same, counter 24 periodically recounts backwards from the same number at the oscillator 26 rate and thus has an output whose frequency is a selected submultiple of the oscillator 26 frequency. The counter output frequency is therefore dependent upon the number set into the register 20. If a relatively large number is loaded into the counter, then it takes the counter longer to count to zero and, therefore, the output pulses occur less frequently. On the other hand, if a small number is loaded into the counter, the counter counts to zero more quickly and, therefore, the output pulses have a higher frequency.

It will be appreciated, therefore, that counter 24 can be made to emit an output having any one of a variety of frequencies simply by selecting the right oscillator 26 frequency and then loading the proper number into register 20. In the illustrated synthesizer, oscillator 26 has a frequency of 10 mHz. Therefore, for example, if different numbers from 121 to 250 are loaded into register 20, the output of counter 24 may be varied in frequency over the above-stated 12.8 kHz. range in 129 discrete frequency increments. In this example, the increments are not equally spaced. As long as a given number is contained in register 20, counter 24 will continue to emit a frequency corresponding to that number for such frequency constant within an accuracy commensurate with the accuracy of the fixed oscillator 26. Moreover, the accuracy and constancy are accomplished without any feedback loops in section 10 and without any refreshment from the remote computer. The absence of feedback loops results in excellent short term stability in addition to the inherent long term stability of the synthesizer.

The capacity of counter 24 is commensurate with that of register 20. Also, preferably, it is a so-called ripple-carry counter because this type is economical to make and also because only the first counter stage propogation delay is critical in the system. That is, when counter 24 counts down to 1, the next pulse from oscillator 26, which causes it to count to zero, changes the condition of only the first stage. This condition is sensed by the decoder in the counter substantially immediately, e.g., within 30 nanoseconds of the oscillator pulse. In response to the output pulse from counter 24, the counter 24 reloads within another 30 nanoseconds or so, after which the count in the counter is no longer zero and the pulse from its decoder drops to zero. Thus, the pulse width of each pulse from counter 24 is typically on the order of 30 nanoseconds. This pulse is delayed in gates 22 sufficiently so that data from register 20 is not loaded into counter 24 until after the end of the previous counter output pulse.

In the present embodiment, the output from counter 24 applied to network 28 may be varied in frequency over more than one octave. In other words, an available frequency at the upper end of the range of section 10 may be more than double an available frequency at the lower end of the range. Therefore, in order to enhance the spectral purity of the signal from synthesizer section 10 by elimination of second and higher harmonics without having to use very expensive narrow passband filters, the signal from register 20 is gated by the output of a decoder indicated generally at 35 to one of two filter sections indicated generally at 32 and 34 in purifying network 28. Section 32 accommodates signals in the upper half of the frequency range, while section 34 accommodates signals in the lower half of the range. The frequency crossover point is selected at some point in the frequency range. For example, a typical crossover point in the illustrated system may be at the number 160 corresponding to a section 10 output frequency of 6.75 kHz.

Filter section 32 comprises a complementing flip-flop 36 having a gated input, followed by a filter 38, a mixer 40 and a second filter 42. Section 34, on the other hand, includes a similar flip-flop 44, a filter 46 and a mixer 48 followed by a second filter 50. The output from each of the filters 42 and 50 is applied to mixer 14 where it is mixed with the output from synthesizer section 12.

Decoder 35 is arranged to provide a signal whenever the number in register 20 is below a given value; i.e., whenever the section 10 is to provide a frequency above the crossover point.

More particularly, if the number loaded into register 20 is less than 160, decoder 35 emits an enabling signal to flip-flop 36 and mixer 40 in filter section 32. Thereupon, each pulse from counter 24 toggles flip-flop 36 so that its output is a square wave signal whose frequency is one-half that of the output pulses from counter 24. That is, flip-flop 36 divides the frequency by two and also serves to equalize the signal power over the range. In other words, it provides a symmetrical signal; i.e., a true square wave, regardless of frequency. Filter 38 is included to reduce the harmonic content of the signal applied to mixer 40.

The pulse train from counter 24 has a very short duty cycle. That is, the width of the pulse is very short compared to the time between pulses. The result is that spectral power is distributed in harmonics and there is very little power available at the desired fundamental frequency. Without flip-flop 36, the filters 38 and 42 would be required to have very high attenuation at the second and higher harmonics to give spectral purity. This would make filters 38 and 42 difficult and expensive to build. Also, the power level of the desired frequency from filters 38 and 42 would be very low, requiring additional amplification.

On the other hand, when flip-flop 36 is used, the power of the desired frequency goes up by a factor of 1000, and is constant at all frequencies. Also, an additional advantage is gained because the wave form from flip-flop 36 is a square wave. This means that the magnitude of the second harmonic and all even harmonics is zero when the square wave is substantially symmetrical. In practice, the square wave from flip-flop 36 is never perfectly symmetrical, but one can easily get second harmonic suppression of 30 db. below the desired frequency, so that the power in the second harmonic is on the order of 1/1000 of the power in the desired frequency. This reduces considerably the cost and complexity of filters 38 and 42.

The price paid for the improvement gained because of flip-flop 36 is that the output frequency is divided by 2. Consequently, to obtain the same output frequency, the oscillator 26 frequency must be doubled when flip-flop 36 is used or, in the case of the coarse tune synthesizer section 12, the output of the section can be multiplied by a further factor of 2 as will be described later. However, this is usually a small price to pay for the improved results.

Mixer 40 mixes input from filter 38 with the signal from a fixed frequency oscillator 52, which in the illustration has a frequency of 10716 mHz. The output of the mixer 40 is applied to a band-pass filter 42 which selectively passes the difference frequency from this mixer to the mixer 14.

If the number loaded into register 20 is reactor than or equal to 160, the resulting output of an inverter 64 included in decoder 35 enables flip-flop 44 and mixer 48 in filter section 34. In this event, the counter 24 output toggles flip-flop 44. The filter 46, mixer 48 and filter 50 provide the same functions as their counterparts in filter section 32. Here, again, the signal applied to mixer 14 is a clean signal devoid of sidebands and harmonics and in the proper frequency range for mixing with the output of synthesizer section 12.

It will be apparent from the foregoing that synthesizer section 10 can be made to generate a variety of frequencies in discrete frequency steps over its range. If the number loaded into register 20 corresponds to a frequency near the upper end of the range, then the system automatically applies the output from counter 24 to the high-frequency filter section 32. On the other hand, when the number contained in register 20 corresponds to a frequency at the lower end of the range, the output of counter 24 is applied to the low-filter section 34. The filter 46 in this section has a cutoff frequency sufficiently low to suppress the second harmonic of the output of the flip-flop 44. If only one filter section were used, it would have to pass the second harmonics of low frequency signals in order to pass the fundamentals of high-frequency signals whose frequencies are more than twice the frequencies of the low-frequency signals. With this arrangement, the output signal of the filter 38 or 40 is a single line spectral line whose harmonics are down about 100 db. This contrasts sharply with the output of a conventional filter whose harmonics are down only about 30 to 40 db. The harmonics in the output are also down as noted because of their wide frequency separation in the filter 38 or 46.

Coarse tune synthesizer section 12 is very similar to section 10 in that it has the same basic components as section 10 and it operates in the very same way. Accordingly, the components of section 12 bear the same identifying number as the corresponding components in section 10 followed by an *a*. Of course, the elements in section 12 do differ from those in section 10 with respect to their storage capacity and frequency response characteristics.

A multiplier 70 is included in section 12 between network **28*a* and mixer 14. This enables section 12 to provide relatively large frequency increments without requiring a very fast and expensive counter 24*a*. That is, it minimizes the required number of counter stages. It also helps to minimize distortion in the mixer 14 output. In a typical embodiment of the invention, multiplier 70 would multiply the output of the signal purifying network 28*a* by approximately 16 times. Also, as mentioned previously, the inclusion of flip-flops 36*a* and 44*a* in network 28*a* accomplishes a frequency division by two. Therefore, the frequency of oscillator 26*a* must be doubled or multiplier 70 should multiply the output of network 28*a* by a further factor of two. It is to be understood that any combination of the frequency of oscillator 26 and of the multiplying factor of multiplier 70** may be used to obtain a desired output frequency.

The capacities of register **20*a* and counter 24*a* are one bit larger than the corresponding elements in synthesizer section 10. This is because the coarse-tune section has a wider frequency range; i.e., a greater ratio between its highest and lowest frequencies. More particularly, the number loaded into register 20*a* may vary from a high of 250 corresponding to a frequency of 23360 kHz. from multiplier 70 to a low of 112 corresponding to a frequency of about 22571 kHz. from the multiplier. The frequency in synthesizer section 12** may be varied between these limits in 138 discrete frequency steps.

Figure 2:
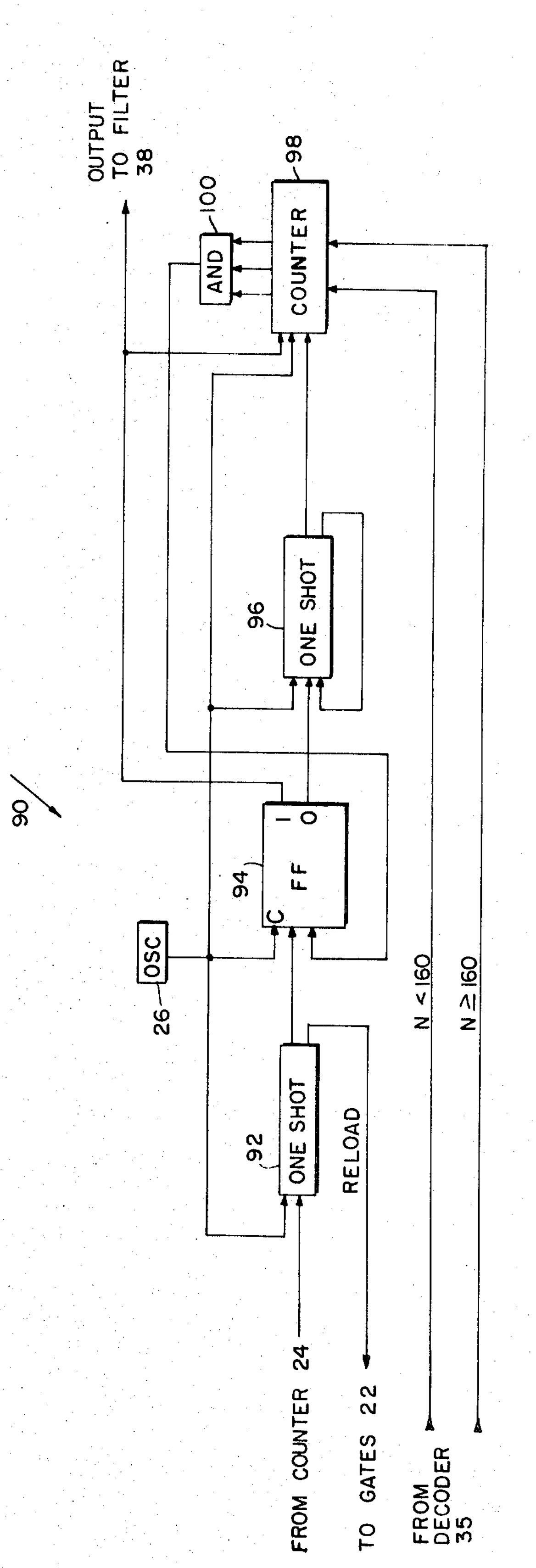
FIG. 2 is a block diagram showing a modified signal-purifying network for the FIG. 1 system.

It is often desirable to have the output of counter 24 in the form of pulses of a selected fixed width instead of the square wave pulses described above which yield constant energy operation. FIG. 2 illustrates a modified purifying network 90 which accomplishes this. Here the pulse from counter 24 (FIG. 1) fires a one shot multivibrator 92 which remains in its unstable state for six clock pulses from oscillator 26. Then, upon its return to stability, it emits a RELOAD pulse to gates 22 (FIG. 1). This assures that the counter has completed its count before it is reloaded and enables the system to operate at clock rates up to as high as 32 mHz.

The output of multivibrator 92 also enables a complementing flip-flop 94. Then the first clock pulse after commencement of the pulse from counter 24 triggers flip-flop 94 so that a voltage level appears at its ONE output terminal. This signal is applied to filter 38 (FIG. 1) as described above. The triggering of flip-flop 94 also fires a second one shot multivibrator 96 which locks itself out for 10 clock pulses. The pulse from multivibrator 96 also starts a count of counter 98 which, for the illustrated example, may have a count capacity of 13. The counter 98 is preset by the outputs of decoder 35 to a count of seven if $N \geq 160$ or to a count of four if $N < 160$. When counter 98 is incremented to thirteen, an AND gate 100 emits a pulse which enables flip-flop 94 so that it resets upon the occurrence of the next clock pulse from oscillator 26, thereby ending the output pulse to filter 38. This operation is then repeated for succeeding output pulses from the counter 24 (FIG. 1) such that a train of pulses of selected fixed width results. In this illustration, then, the network has a jitter-free output 67 times the clock pulse width when $N < 160$ and 100 times the clock pulse width when $N \geq 160$. It will be appreciated, then, that networks of the type embodied in FIG. 2 are capable of providing pulses of selected fixed widths in a stable and reliable manner.

It will be appreciated from the foregoing then that the synthesizer described herein yields an output which is variable in selected frequency increments over a wide range. Still, however, the synthesizer has the accuracy of a fixed frequency oscillator. Moreover, the output is substantially free of side bands and harmonics.

It will thus be seen that the objects set forth above, among those made apparent from the preceding description, are efficiently attained, and, since certain changes may be made in the above article without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

I claim:

1. A variable frequency synthesizer comprising:
A. a fixed frequency oscillator;
B. a counter for counting pulses from said oscillator;
C. means for controlling said counter so that said counter counts from a first count to a second second count;
D. means for emitting an output pulse each time said counter reaches said second count, said pulse being applied to said controlling means to cause them to recycle said counter;
E. means for controlling the difference between said first and second counts so as to vary the frequency of said output pulses; and
F. a signal-purifying network for removing sidebands and harmonics from said emitting means output.

2. A variable frequency synthesizer as defined in claim 1 wherein said signal-purifying network comprises:
A. a first filter section having a first passband characteristic;
B. a second filter section having a second passband characteristic;
C. means for switching said output pulses to said first filter section when the difference between the counts in said counter exceeds a predetermined amount; and
D. means for switching said output pulses to said second filter section when the difference between the counts in said counter is below said predetermined amount.

3. A variable frequency synthesizer as defined in claim 2 wherein each said filter section comprises:
A. a complementing flip-flop arranged to be toggled by said output pulses;
B. a filter connected to filter the output of said flip-flop;
C. an oscillator; and
D. a mixer for mixing the outputs of said filter and said oscillator to develop an output signal whose frequency varies with the frequency of said output pulses.

4. A variable frequency synthesizer comprising:
A. a register for storing numbers in binary form;
B. a fixed frequency oscillator;
C. a counter for counting pulses from said oscillator;
D. means for loading a number from said register into said counter so that said counter commences counting from said number to another predetermined number;
E. means for emitting an output pulse each time said counter reaches said other number, each said output pulse also being applied to said loading means to reload said number into said counter so that the synthesizer continues to emit output pulses whose frequency is determined by said number; and
F. a signal-purifying circuit connected to filter harmonics and sidebands from the output of said pulse-emitting means.

5. A variable frequency synthesizer as defined in claim 4 wherein said purifying circuit includes a first filter section which comprises:
A. a complementing flip-flop arranged to be toggled by said output pulses;
B. a second oscillator;
C. means; mixer for mixing the outputs of said second oscillator and said flip-flop to develop an output signal whose frequency varies with the frequency of the pulses from said pulse-emitting means; and
D. one or more filters for filtering the sidebands and harmonics from the output of said flip-flop.

6. A variable frequency synthesizer as defined in claim 5 and further including:
A. a second filter section similar to the first, included in said purifying circuit;
B. means for gating the pulses from said pulse-emitting means to said first filter section when the number in said register exceeds a predetermined value; and
C. means for gating the pulses from said pulse-emitting means to said second filter section when the number in said register does not exceed said predetermined value.

7. A variable frequency synthesizer as defined in claim 4 and further including means responsive to said number and to the output pulses from said pulse emitting means for controlling the pulse width of said output pulses as a function of said number.

8. A variable frequency synthesizer as defined in claim 4 wherein:
A. said pulse emitting means comprises a monostable multivibrator which:
1. assumes its unstable state each time said counter reaches said other number,
2. remains in said unstable state for a selected number of pulses from said oscillator, and
3. emits a said output pulse each time time it returns to said stable state to insure that said counter has counted to said other number before it is reloaded with said number;
B. a complementing flip-flop
1. connected to said multivibrator, and
2. arranged to emit an output signal when said multivibrator is in its unstable state;
C. a second counter arranged to count pulses from said oscillator;
D. means for controlling the length of the count of said second counter; and
E. means for emitting an output each time said second counter completes its count, said output being applied to reset said flip-flop so that its output has a pulse width which is is dependent upon the number loaded into said second counter.

9. A variable frequency synthesizer as defined in claim 8 wherein said controlling means causes said second counter to:
A. count through one count when said number in said register exceeds a predetermined value; and
B. count through a different count when said number in said register does not exceed said value so that the pulse width of the output of said flip-flop depends upon the frequency of said synthesizer output pulses.

10. A variable frequency synthesizer as defined in claim 4 and further including:
A. first and second filter sections having first and second passband characteristics, respectively, included in said purifying circuit;
B. means for switching said output pulses to said first filter section when the number in said register exceeds a predetermined magnitude; and
C. means for switching said output pulses to said second filter section when said number does not exceed said predetermined magnitude so that the output of said synthesizer has a relatively low harmonic content over a relatively wide range of frequencies.

11. A variable frequency synthesizer as defined in claim 10 wherein each said filter section includes:
A. a complementing flip-flop
1. which is toggled by said output pulses, and
2. whose output has a frequency which is half the frequency of said output pulses; and
B. a filter for filtering the output of said flip-flop.

12. A variable frequency synthesizer as defined in claim 10 and further including:
A. a second synthesizer section similar to the first said synthesizer; and
B. means for mixing the outputs of said synthesizer sections.

13. A variable frequency synthesizer as defined in claim 12 wherein:
A. one of said synthesizer sections is arranged to emit signals in relatively large frequency increments over a relatively large frequency range; and B. the other section is arranged to emit signals in smaller increments over a smaller range so that said two sections may be used together as a coarse and fine tunable frequency source.

14. A variable frequency synthesizer comprising:

A. a register for storing numbers in binary form;

B. a fixed frequency oscillator;

C. a counter for counting pulses from said oscillator;

D. means for loading a number from said register into said counter so that said counter commences counting from said number to another predetermined number;

E. means for emitting an output pulse each time said counter reaches said other number, each said output pulse also being applied to said loading means to reload said number into said counter so that the synthesizer continues to emit output pulses whose frequency is determined by said number; and F. means responsive to said number and to said output pulses of the pulse-emitting means for controlling the widths of said output pulses as a function of the value of said number.

15. The invention according to claim 14 wherein said controlling means includes:

1. a second counter arranged to count pulses from said oscillator for a count length dependent upon the value of said number; and 2. means for producing a signal each time said second counter completes its count, said signal being applied to said pulse-emitting means to control said pulse widths.

PO-1050
(5/69)

UNITED STATES PATENT OFFICE
CERTIFICATE OF CORRECTION

Patent No. 3,568,069 Dated March 2, 1971

Inventor(s) William D. Gabor

It is certified that error appears in the above-identified patent and that said Letters Patent are hereby corrected as shown below:

Column 5 Line 36 change "reactor" to --greater-- ; Column 5 Line 6 after "single" delete --line--; Column 7 Line 66 change "means" to -

Signed and sealed this 22nd day of June 1971.

(SEAL)
Attest:

EDWARD M.FLETCHER,JR.
Attesting Officer

WILLIAM E. SCHUYLER, J
Commissioner of Patent